United States Patent
Jung et al.

(10) Patent No.: US 7,122,427 B2
(45) Date of Patent: Oct. 17, 2006

(54) METHOD OF FABRICATING NON-VOLATILE MEMORY DEVICE

(75) Inventors: Sung Mun Jung, Kyunggido (KR); Jum Soo Kim, Kyunggido (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/019,301

(22) Filed: Dec. 23, 2004

(65) Prior Publication Data

US 2005/0142725 A1    Jun. 30, 2005

(30) Foreign Application Priority Data

Dec. 27, 2003    (KR) ...................... 10-2003-0098357

(51) Int. Cl.
*H01L 21/8247*    (2006.01)

(52) U.S. Cl. ..................................... 438/257; 438/296

(58) Field of Classification Search ........ 438/257–267, 438/296
See application file for complete search history.

(56) References Cited

U.S. PATENT DOCUMENTS

2004/0266111 A1*  12/2004  Lee .............................. 438/264
2005/0176200 A1*   8/2005  Wang et al. ................. 438/257

\* cited by examiner

*Primary Examiner*—Richard A. Booth
(74) *Attorney, Agent, or Firm*—Finnegan, Henderson, Farabow, Garrett, & Dunner, L.L.P.

(57) ABSTRACT

The present invention provides a method of fabricating a non-volatile memory device, in which trench isolation can be achieved using an insulating layer that needs no separate removal process. The present invention includes sequentially forming a first insulating layer, a first conductor layer, and a second insulating layer on a semiconductor substrate, patterning the second insulating layer, the first conductor layer, and the first insulating layer to expose a prescribed portion of the semiconductor substrate, forming a trench having a prescribed depth in the semiconductor substrate by removing the exposed portion of the semiconductor substrate, forming a third insulating layer on the second insulating layer including the trench, planarizing the third insulating layer to remove the second insulating layer until the first conductor layer is exposed, forming a fourth insulating layer on the exposed first conductor layer and the remaining third insulating layer, and forming a second conductor layer on the fourth insulating layer.

6 Claims, 2 Drawing Sheets

METHOD OF FABRICATING NON-VOLATILE MEMORY DEVICE

This application claims the benefit of the Korean Application No. P2003-0098357 filed on Dec. 27, 2003, which is hereby incorporated by reference.

BACKGROUND OF THE INVENTION

1. Field of the Invention

The present invention relates to a method of fabricating a semiconductor memory device, and more particularly, to a method of fabricating a non-volatile memory device having trench isolation.

2. Discussion of the Related Art

Generally, semiconductor memory devices are categorized into a volatile memory device, which loses data in case of cutting off power supply, such as DRAM (dynamic random access memory) and SRAM (static random access memory) and a non-volatile memory device, which saves data in spite of cutting off power supply, such as a flash memory device.

The non-volatile memory device generally has a stacked gate configuration that floating and control gates are stacked on a semiconductor substrate in a vertical direction. A tunnel oxide layer is inserted between the floating gate and the semiconductor substrate. And, an ONO (oxide/nitride/oxide) layer is inserted between the floating and control gates.

In the non-volatile memory device having the stacked gate configuration, a trench isolation layer becomes more popular as a device isolation layer than a LOCOS layer to cope with the tendency of the increasing degree of integration of a device. In forming a non-volatile memory device having the trench isolation layer, trench isolation is preferentially carried out in a manner of forming an oxide layer pattern, a polysilicon layer pattern for a floating gate, and a nitride layer pattern on a semiconductor substrate, forming a trench in the semiconductor substrate, and filling the trench with an oxide layer. Subsequently, a stacked gate configuration or structure is then formed in a manner of removing the nitride layer pattern, forming an ONO layer, and forming a polysilicon layer for a control gate.

In the related art fabricating method, planarization is carried out on the oxide layer filling the trench. In doing so, the nitride layer is used as an etch stop layer.

However, wet etch should be performed to remove the nitride layer after completion of the planarization, whereby overall process steps are raised.

Moreover, the nitride layer pattern is removed using a $H_3PO_4$ solution, whereby the polysilicon layer pattern beneath the nitride layer pattern is damaged by the $H_3PO_4$ solution.

SUMMARY OF THE INVENTION

Accordingly, the present invention is directed to a method of fabricating a non-volatile memory device that substantially obviates one or more problems due to limitations and disadvantages of the related art.

An object of the present invention is to provide a method of fabricating a non-volatile memory device, in which trench isolation can be achieved using an insulating layer that needs no separate removal process.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of fabricating a non-volatile memory device according to the present invention includes the steps of sequentially forming a first insulating layer, a first conductor layer, and a second insulating layer on a semiconductor substrate, patterning the second insulating layer, the first conductor layer, and the first insulating layer to expose a prescribed portion of the semiconductor substrate, forming a trench having a prescribed depth in the semiconductor substrate by removing the exposed portion of the semiconductor substrate, forming a third insulating layer on the second insulating layer including the trench, planarizing the third insulating layer to remove the second insulating layer until the first conductor layer is exposed, forming a fourth insulating layer on the exposed first conductor layer and the remaining third insulating layer, and forming a second conductor layer on the fourth insulating layer.

Preferably, the first insulating layer is a thermal oxide layer by thermal oxidation, the first and second conductor layers are polysilicon layers, the second and third insulating layers are oxide layers by chemical vapor deposition, and the fourth insulating layer is an oxide/nitride/oxide layer.

More preferably, the second insulating layer is the oxide layer by high density plasma chemical vapor deposition.

Preferably, the first insulating layer is 50~200 Å thick, the first conductor layer is 500~3,000 Å thick, and the second insulating layer is 500~4,000 Å thick.

Preferably, the second insulating layer is removed in the planarizing step using the first conductor layer as an etch stop layer.

Preferably, the second insulating layer is removed by chemical mechanical polishing.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1 to 4 are cross-sectional diagrams for explaining a method of fabricating a non-volatile memory device according to the present invention.

Figure 1:
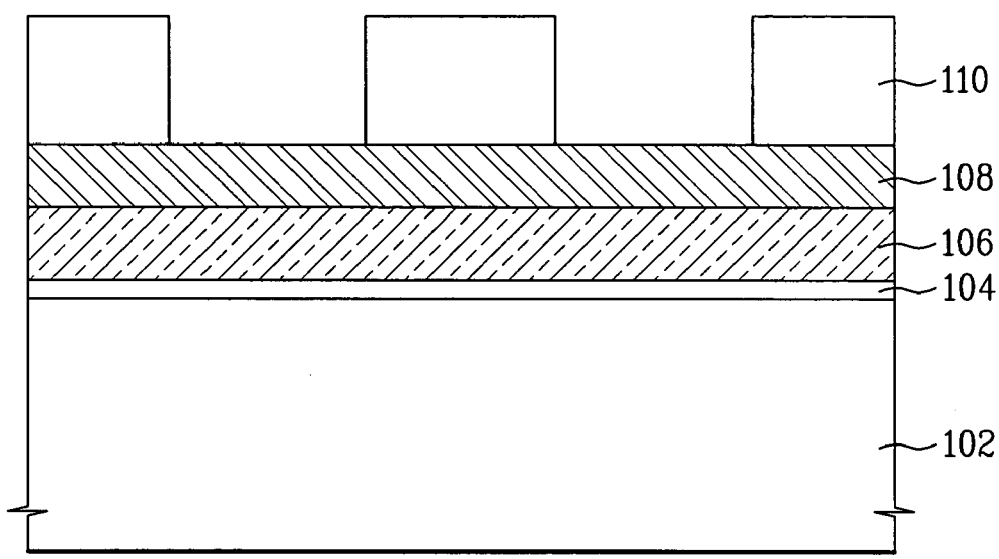
FIGS. 1 to 4 are cross-sectional diagrams for explaining a method of fabricating a non-volatile memory device according to the present invention.

Referring to FIG. 1, a first insulating layer 104, a first conductor layer 106, and a second insulating layer 108 are sequentially formed on a semiconductor substrate 102 such as a silicon substrate. In doing so, the first insulating layer 104 is formed 50~200 Å thick by thermal oxidation to be used as a tunnel oxide layer. The first conductor layer 106 is formed of polysilicon to have a thickness of 500~3,000 Å. The first conductor layer 106 may be formed by low pressure chemical vapor deposition (LPCVD), and a separate doping process can be performed on the polysilicon layer 106. And, the second insulating layer 108 is formed of a high density plasma oxide layer by CVD to have a thickness of 500~4,000 Å.

Subsequently, a mask layer pattern 110, e.g., a photoresist pattern is formed on the second insulating layer 108. In doing so, the mask layer pattern 110 has an opening exposing a partial surface of the second insulating layer 108.

Figure 2:
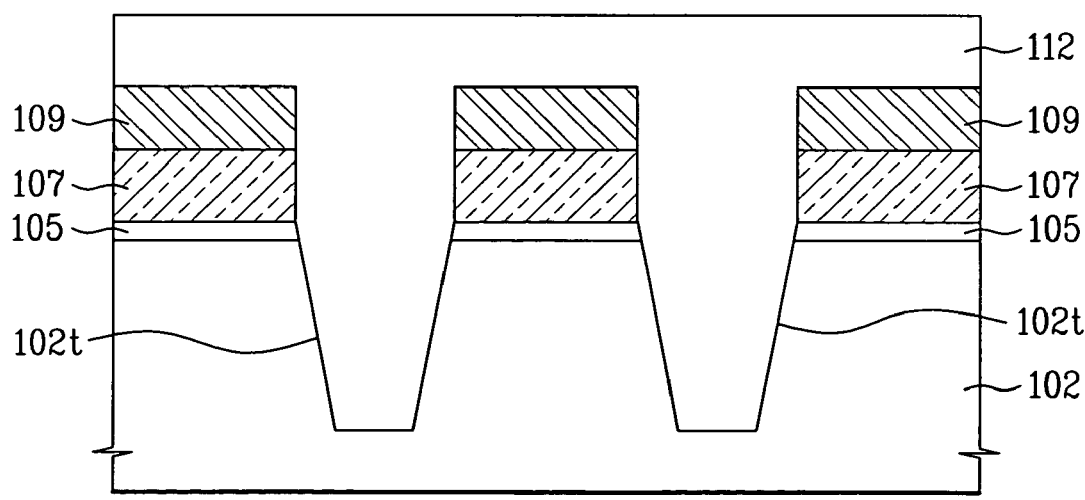

Referring to FIG. 2, the second insulating layer 108, the first conductor layer 106, and the first insulating layer 104 are sequentially removed by etch using the mask layer pattern 110 in FIG. 1 as an etch mask to expose a partial surface of the semiconductor substrate 102. Specifically, the exposed portion of the semiconductor substrate 102 corresponds to a device isolation area that will be formed later.

Subsequently, the exposed portion of the semiconductor substrate 102 is etched to a prescribed depth using the mask layer pattern 110 as an etch mask, whereby a trench 102t is provided to the device isolation area of the semiconductor substrate 102.

After completion of the trench 102t, the mask layer pattern 110 is removed.

Hence, the first insulating layer pattern 105, the first conductor layer pattern 107, and the second insulating layer pattern 109 are sequentially stacked on the active area of the semiconductor substrate 102, whereas the trench 102t is arranged in the device isolation area of the semiconductor substrate 102.

Subsequently, a third insulating layer 112 is formed over the substrate including both of the second insulating layer pattern 109 and the trench 102t by CVD. In ding so, the third insulating layer 112 fills up the trench 102t and covers the second insulating layer pattern 109.

Figure 3:
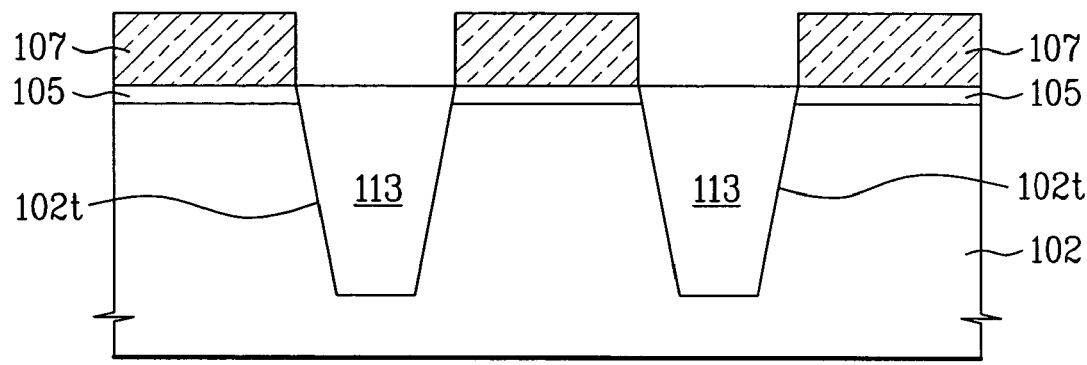

Referring to FIG. 3, planarization is carried out over the substrate. In doing so, the planarization is performed by chemical mechanical polishing (CMP) using the first conductor layer pattern 107 as an etch stop layer. Namely, the planarization is executed until a surface of the first conductor layer pattern 107 is exposed, whereby the second insulating layer pattern 109 in FIG. 2 is removed together with a portion of the third insulating layer 112.

After completion of the planarization, an upper portion of the remaining third insulating layer 112 is further removed to form a trench isolation layer 113.

Figure 4:
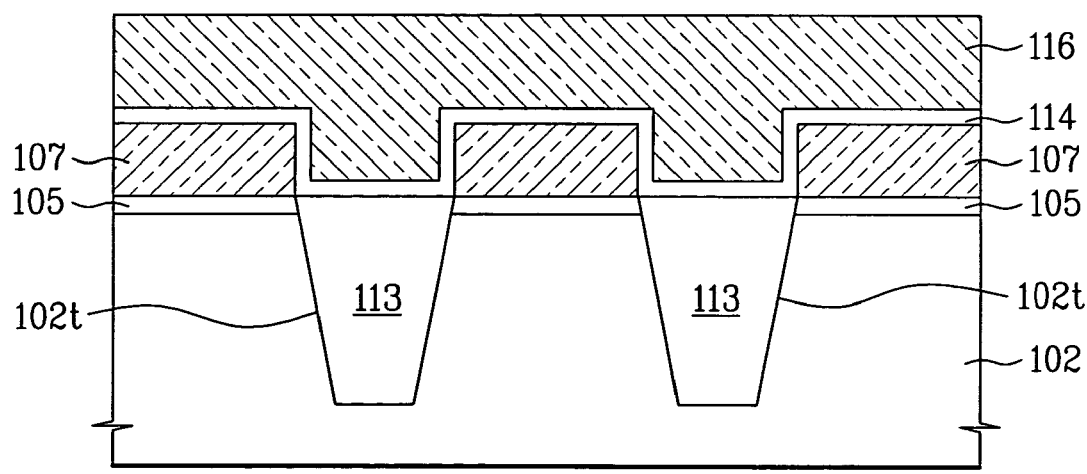

Referring to FIG. 4, a fourth insulating layer 114 is formed on the second conductor layer pattern 107 and the trench isolation layer 113. In doing so, the fourth insulating layer 114 is formed as a gate insulating layer including an ONO (oxide/nitride/oxide) layer. The fourth insulating layer 114 may be formed by general thermal oxidation but is preferably formed by low pressure chemical vapor deposition.

Subsequently, a second conductor layer 116 for a control gate is formed on the fourth insulating layer 114. In doing so, the second conductor layer 116 is formed of polysilicon like the first conductor layer 106 in FIG. 1.

Accordingly, the present invention provides the following advantages or effects.

First of all, by filing up the trench with the oxide layer and planarizing the oxide layer using the polysilicon layer as the etch stop layer, the present invention does not need the separate step of removing the related art nitride layer, thereby simplifying the fabricating process.

Secondly, since the present invention does not need the step of removing the related art nitride layer, the polysilicon layer can be prevented from being damaged by $H_3PO_4$ used in removing the related art nitride layer.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a non-volatile memory device, comprising the steps of:
    sequentially forming a first insulating layer, a first conductor layer, and a second insulating layer on a semiconductor substrate;
    patterning the second insulating layer, the first conductor layer, and the first insulating layer to expose a prescribed portion of the semiconductor substrate;
    forming a trench having a prescribed depth in the semiconductor substrate by removing the exposed portion of the semiconductor substrate;
    forming a third insulating layer on the second insulating layer including the trench;
    planarizing the third insulating layer to remove the second insulating layer until the first conductor layer is exposed;
    forming a fourth insulating layer on the exposed first conductor layer and the remaining third insulating layer; and
    forming a second conductor layer on the fourth insulating layer.

2. The method of claim 1, wherein the first insulating layer is a thermal oxide layer by thermal oxidation, the first and second conductor layers are polysilicon layers, the second and third insulating layers are oxide layers by chemical vapor deposition, and the fourth insulating layer is an oxide/nitride/oxide layer.

3. The method of claim 2, wherein the second insulating layer is the oxide layer by high density plasma chemical vapor deposition.

4. The method of claim 1, wherein the first insulating layer is 50~200 Å thick, the first conductor layer is 500~3,000 Å thick, and the second insulating layer is 500~4,000 Å thick.

5. The method of claim 1, wherein the second insulating layer is removed in the planarizing step using the first conductor layer as an etch stop layer.

6. The method of claim 1, wherein the second insulating layer is removed by chemical mechanical polishing.

* * * * *